United States Patent [19]

Foner

[11] 4,037,149
[45] July 19, 1977

[54] MULTIPLE MODE MAGNETOMETERS
[76] Inventor: Simon Foner, 31 Payson Terrace, Belmont, Mass. 02178
[21] Appl. No.: 641,741
[22] Filed: Dec. 18, 1975
[51] Int. Cl.$^2$ ............................................. G01R 33/12
[52] U.S. Cl. .................................................. 324/34 R
[58] Field of Search ................ 324/43 R, 43 L, 43 G, 324/47, .5 E, 14, 13, 34 R

[56] References Cited
U.S. PATENT DOCUMENTS

| | | | |
|---|---|---|---|
| 2,946,948 | 7/1960 | Foner | 324/47 X |
| 3,191,118 | 6/1965 | Jung et al. | 324/.5 E |
| 3,252,081 | 5/1966 | Ruddock et al. | 324/.5 E |
| 3,496,459 | 2/1970 | Foner | 324/47 |
| 3,524,128 | 8/1970 | Hearn | 324/.5 E |
| 3,904,956 | 9/1975 | O'Brien et al. | 324/43 R |

*Primary Examiner*—Gerard R. Strecker
*Attorney, Agent, or Firm*—Weingarten, Maxham & Schurgin

[57] ABSTRACT

A magnetometer in which at least two modes of drive are employed in exciting sensor and/or sample so that the sensor provides an output indication of magnetic moment which is a function of both drive modes. The drive modes may be periodic at specific driving frequencies, aperiodic or may comprise a unidirectional portion of a mode. The output of the sensor contains components representative of the frequency or frequencies of the first mode modulated at the frequency or frequencies of the second mode. This sensor output is then analyzed to provide an indication of sample magnetic moment as a function of the frequency components of both modes of drive in order to eliminate contributions to the indicated magnetic moment from background signals or other perturbations which may be present under single mode operation. The multiple mode magnetometer is useful in several embodiments for production line applications, investigations of magnetic properties of inhomogeneous magnetic materials, as well as for general magnetic moment measurements. The concept of a multimode magnetometer also may be extended to include a multiplicity of modes.

59 Claims, 11 Drawing Figures

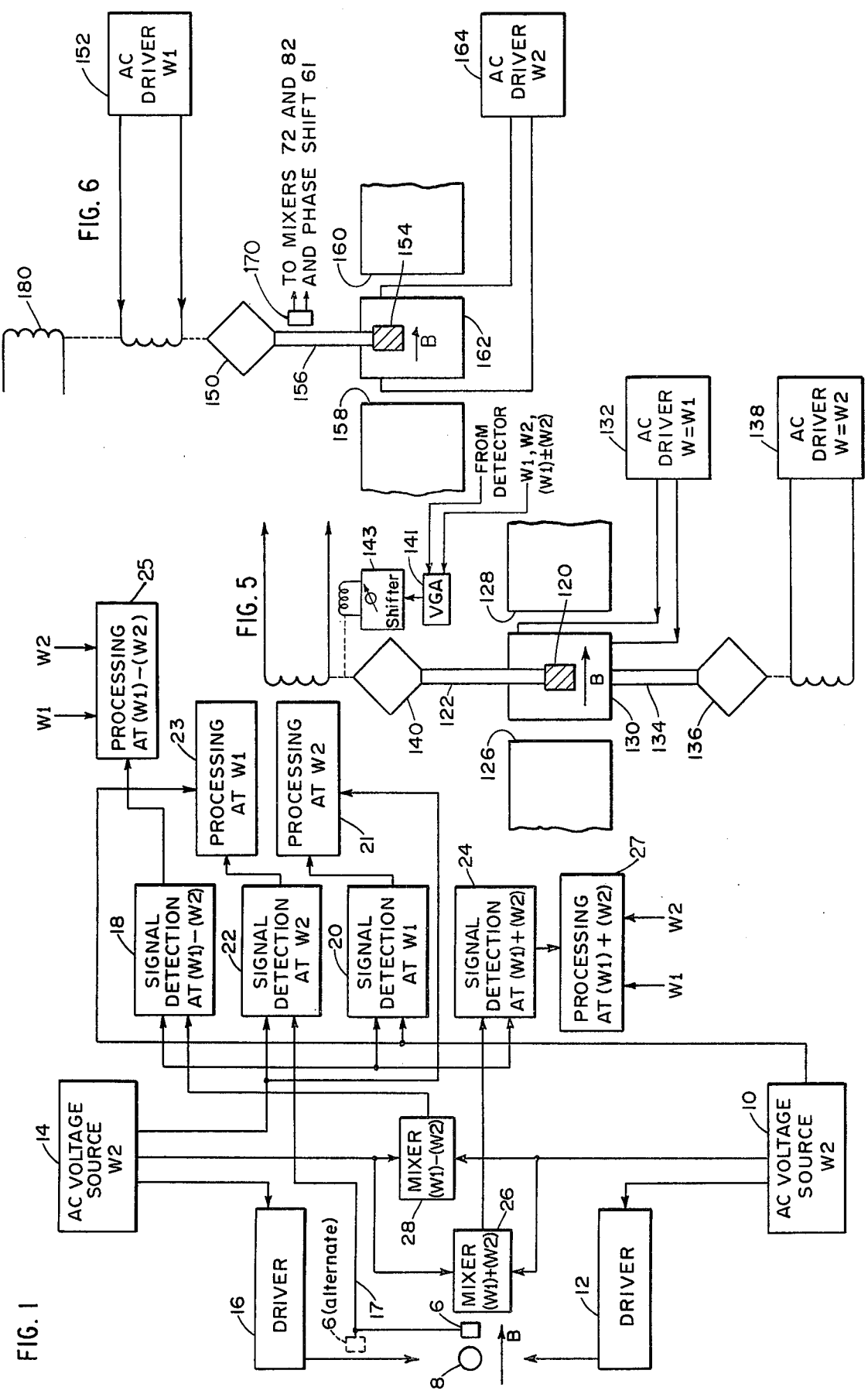

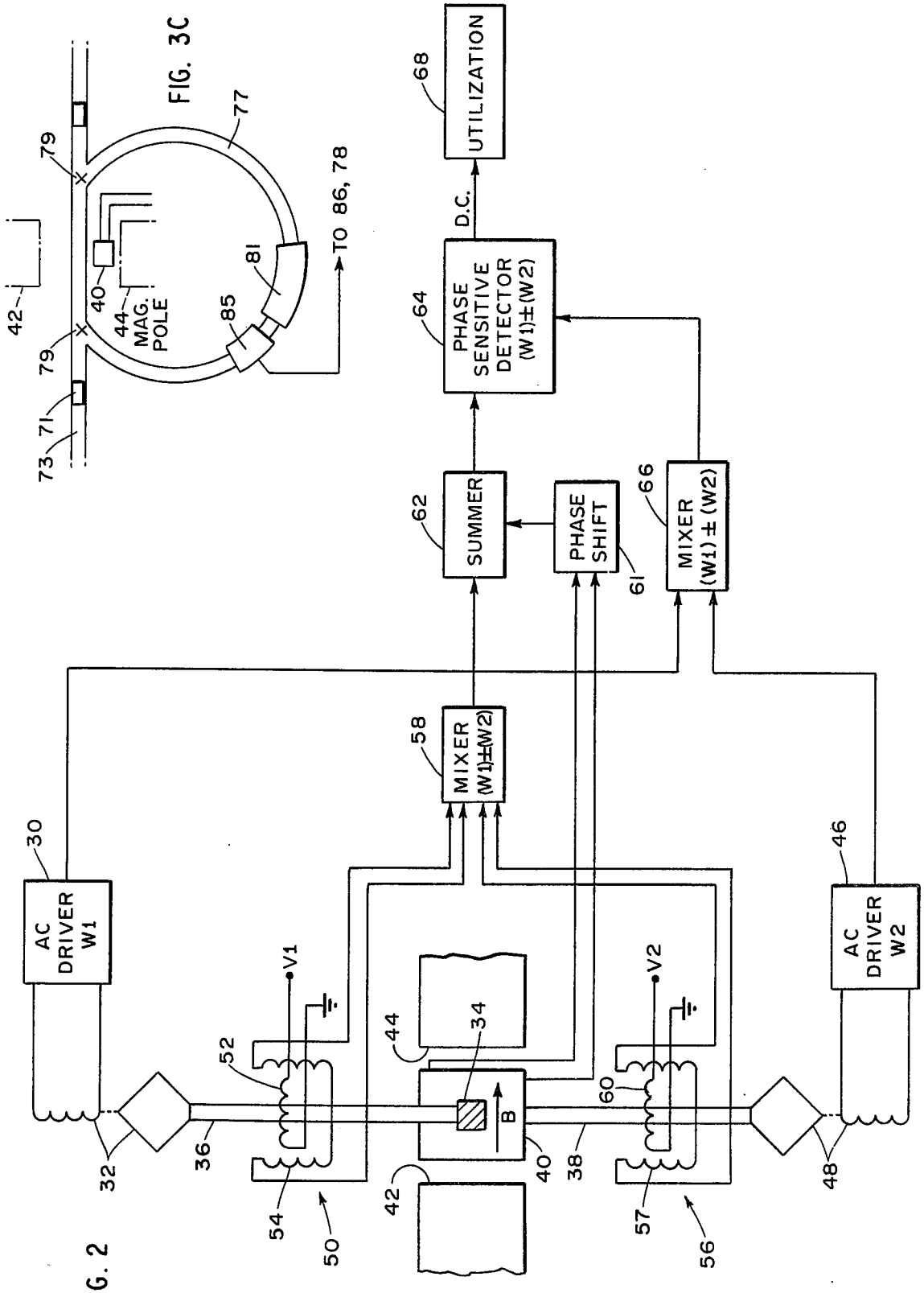
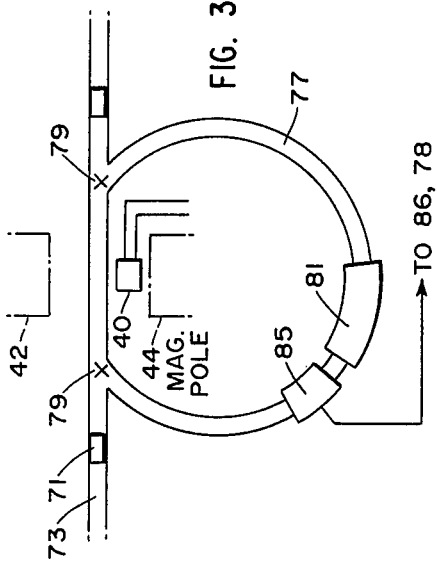

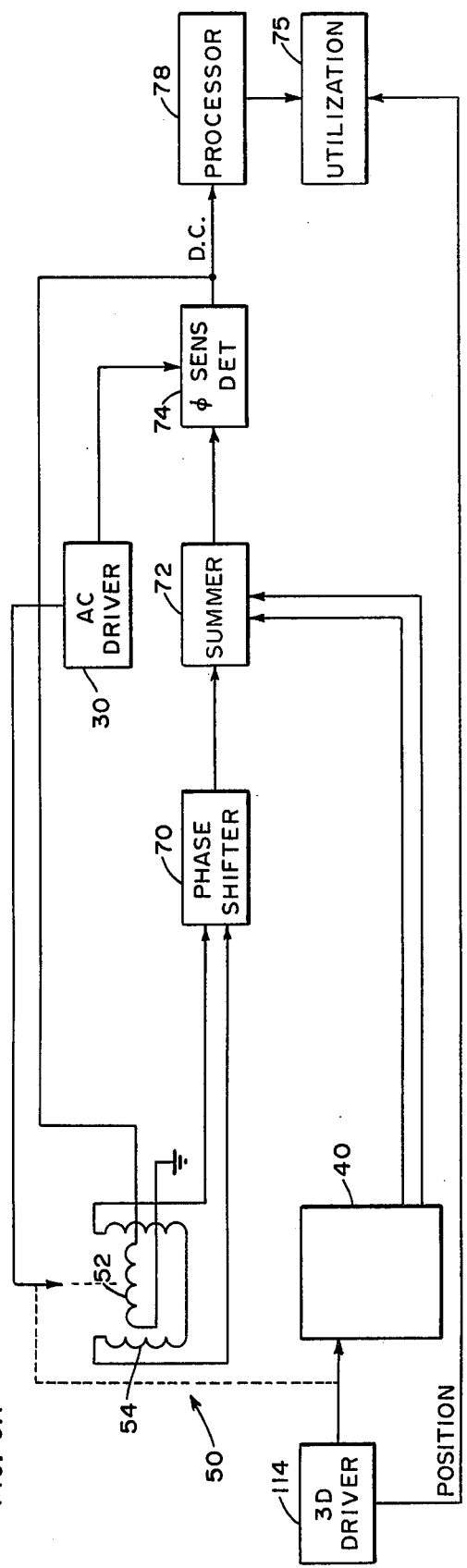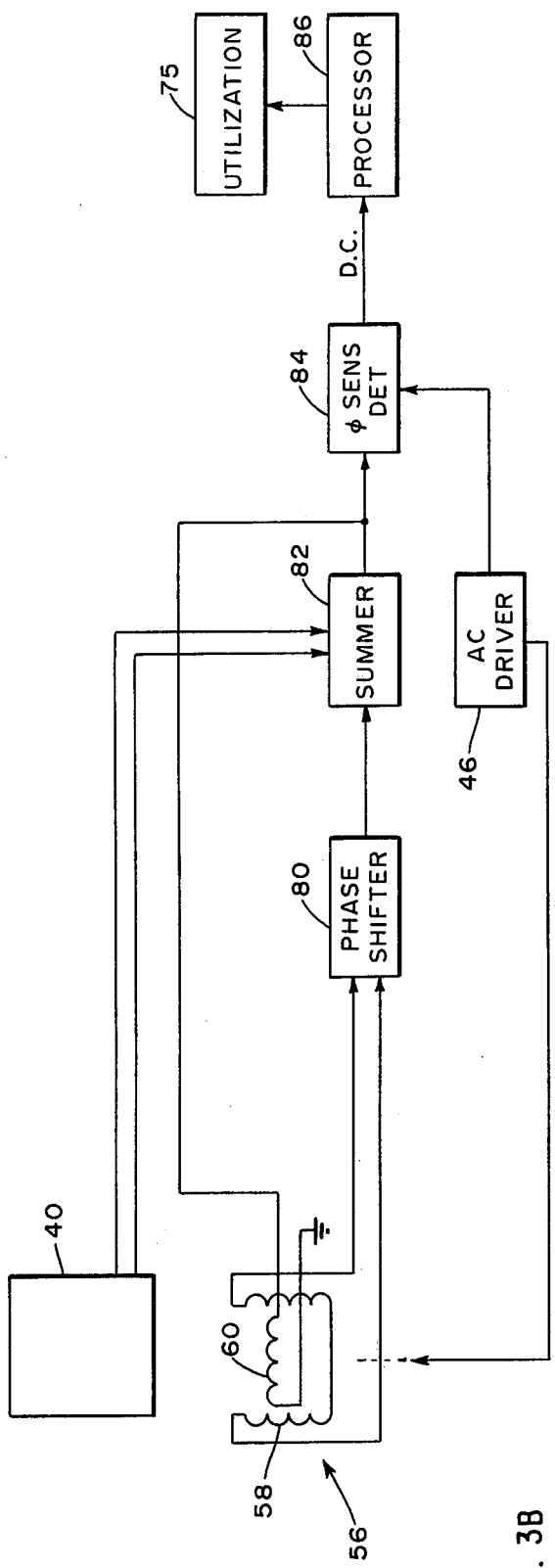
FIG. 3A
FIG. 3B

MULTIPLE MODE MAGNETOMETERS

FIELD OF THE INVENTION

This invention relates to magnetometers and more particularly to a magnetometer having an output indication of magnetic moment which utilizes at least two drive modes.

BACKGROUND OF THE INVENTION

By definition, unit magnetization or more specifically, unit magnetic moment in the centimeter-gram-second (CGS) system is possessed by a magnet formed by magnetic poles of opposite sign and of unit strength, one centimeter apart. The magnetic moment may be expressed for example as units per gram or per cubic centimeter. Techniques for measuring the magnetic moment of a material generally fall into several broad classes, one of which is now known as a vibrating sample magnetometer. An exemplary vibrating sample magnetometer for measuring magnetic moment which measures the change in flux when a sample is vibrated in a substantially uniform magnetic field is described in U.S. Pat. No. 2,946,948 of the present inventor. A detector such as an inductive coil pickup is positioned adjacent to the vibrating sample to detect the change of magnetic flux produced by the moving sample and a reference detector is disposed adjacent to a reference magnet to generate a signal with a known phase relationship to the motion of the sample. The output signal, indicating magnetic flux change which is proportional to the sample magnetic moment, and the reference signal are differentially combined to provide a null output or a difference signal.

Improvements of the vibrating sample magnetometer of the aforementioned U.S. Pat. No. 2,946,948 are described in U.S. Pat. No. 3,496,459, also of the present inventor. According to that patent, the output signals from the magnetometer sensor are analyzed at a frequency which is a harmonic of the vibration frequency of the sample. A further improvement in such a magnetometer includes circuitry to compensate for out-of-phase signals including eddy currents as is described in copending U.S. patent application Ser. No. 513,090, filed Oct. 8, 1974, also of the present inventor.

An alternating force magnetometer analogous to the vibrating sample magnetometer described above, but in which force is applied to a sample by subjecting the sample to a periodically varying magnetic field gradient, is described in a paper by R. Reeves, entitled, "An Alternating Force Magnetometer," page 547, Journal of Physics E: Scientific Instruments, 1972, Volume 5.

Magnetometers in which a sample is placed in the vicinity of a vibrating coil are also known. In such magnetometers, a background AC signal is generated by vibration of the sensing coil in the region of the sample in the presence of the applied magnetic field. The AC output of the vibrating coil, however, reflects nonuniformities of the applied field and nonuniform fields produced by materials surrounding the sample or other outside factors. This dependency which may vary with time, makes measurements of the sample moment by a vibrating coil magnetometer susceptible to these background errors.

A rotating sample magnetometer is also described in articles by P. J. Flanders, entitled "Utilization of a Rotating Sample Magnetometer," Review of Scientific Instruments, Volume 41, No. 5, pp. 697–710, May 1970, and in an article by Stephen J. Hudgens, entitled "Rotating Sample Magnetometer for Diamagnetic Measurements," page 579, Review of Scientific Instruments, Volume 44, No. 5, May 1973.

SUMMARY OF THE INVENTION

According to the invention, a magnetometer is provided in which at least two modes of drive are employed in exciting the sensor and/or sample so that the sensor provides an output indication of magnetic moment which is a function of both drive modes. By analyzing or demodulating this output, an accurate measure of magnetic moment is provided free of the errors associated with the prior art involving moving element magnetometers. The dual mode drive may be achieved in several alternative manners. The sensor and sample may both be excited at distinct frequencies or with aperiodic functions.

In one preferred embodiment of the invention comprising a combination moving sample and moving coil magnetometer a sample is driven in any of several predetermined motions. These include small amplitude periodic, large amplitude periodic, or aperiodic motions as well as a translation and/or rotation of any of the possible directions. In large amplitude motion, the sample is driven from a point at which the presence of the sample is not detected by the coils to a location within the range of detectability of the sample. The sample may also be driven in periodic or aperiodic motions in a region entirely within the range of sensitivity of the coils or a combination of periodic and aperiodic sample motion may be employed. To provide the second mode of drive, the sensor coil is also moved at a distinct frequency or mode. Relative motion between the sample and sensor may be added in these embodiments as a further mode of drive or as a substitute, for example, to vibrating the sample as may be desired for production line analysis. The know characteristic of the relative motion between coil and sample, one of the modes of drive, is then used to analyze the sensor output for magnetic moment. Combinations of the several modes may be utilized. The modes may involve other functions. For instance, a second mode could involve a periodic or aperiodic variation in temperature or optical input which would furnish a modulation of the first mode.

The output of the sensor contains a signal component at the frequency at which the coils are vibrated, modulated by the frequency of sample motion. The magnetic moment of the sample is detected by analyzing the output signal at the sum or difference frequencies of both modes or at their harmonics. In this manner, the errors in magnetic moment such as from background fields that are superimposed on one mode of drive can be effectively eliminated by demodulation at functions of both modes of drive.

The features of this invention can also be achieved in an embodiment in which forces varying in one mode are applied to the sample by electrically driving a coil near the sample to provide a time varying gradient magnetic field in the vicinity of the sample. Either the sample or the coil is then driven in a second mode. Forces on the sample are detected and analyzed at both modes to provide the indication of magnetic moment.

Additional relative motion (general motion which means displacement and/or rotation) between the sample and coil may be added to any of the above embodiments or substituted, in certain cases, for one of the modes of drive. An electrical representation of this relative motion is then used in analyzing the output of the detector to provide the magnetic moment of the sample. This aspect of the invention provides the advantages of dual mode detection of the magnetic moment of articles on production lines or during processing where access to the article is allowed during part of the time and its magnetic moment is examined during one or more traversals of the detector region of sensitivity.

BRIEF DESCRIPTION OF THE DRAWING

The invention will be more fully understood from the following detailed description taken in conjunction with the drawing in which:

FIG. 1 is a general block diagram of a magnetometer according to the invention;

FIG. 2 is a diagram of a first embodiment of the invention in a combination vibrating sample — vibrating coil magnetometer;

FIG. 3A is a diagram of an embodiment of the invention typically for large amplitude, unidirectional motion;

FIG. 3B is a diagram of an alternative embodiment for the FIG. 3A function;

FIG. 3C is a diagram of a monitoring system using the FIG. 3A or 3B circuitry;

FIG. 5 is a diagram of a second embodiment of the invention in a combination applied force — vibrating sample magnetometer; and FIG. 6 is a diagram of a third embodiment of the invention in a combination applied force-vibrating coil magnetometer.

DETAILED DESCRIPTION OF THE PREFERRED EMBODIMENT

Figure 4C:
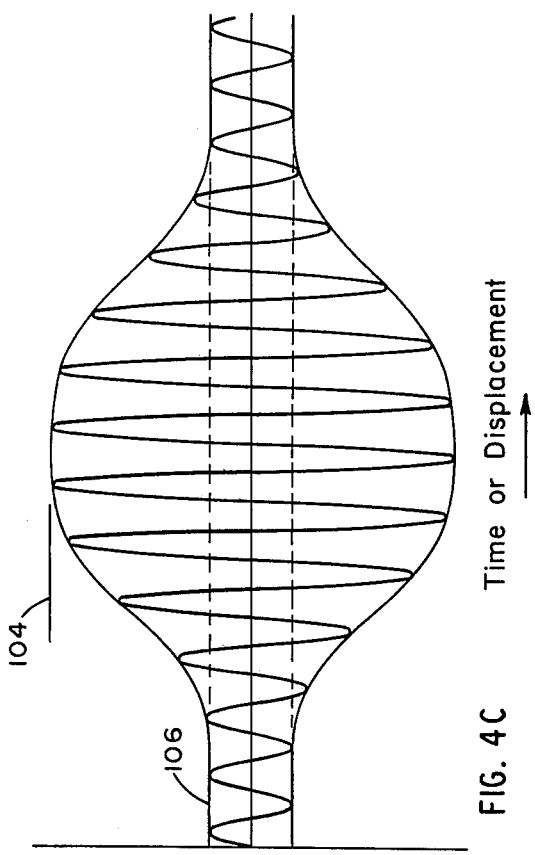
FIGS. 4A-4D are a series of waveform diagrams useful in explaining the operation of the invention.

The present invention contemplates a magnetometer in which two or more driving modes or frequencies are present. In the magnetometer, a sample and coil are associated and driven in several alternative combinations by two distinct modes or frequencies such that the detected signal has components of the first mode modulated by components of the second mode. The circuitry employed to analyze that signal acts on the modulated signal in order to eliminate error signals occurring exclusively at either mode. Such a magnetometer and the circuitry associated with it is illustrated generally in block diagram form in FIG. 1. Specific embodiments of the invention incorporating various combinations of multiple mode vibrating sample — vibrating coil, and — applied force magnetometers will be described in detail below with respect to the specific circuit representations shown in FIGS. 2-6 of the drawing.

The general principles of operation of the invention may be understood by reference to the generalized block diagram illustrated in FIG. 1. As shown in FIG. 1, a magnetic field B magnetizes sample 8 and is detected by sensor coil 6 placed near sample 8. (An alternate location for sensor 6 is to detect the motion or force applied to the sample 8 by a driver 16.) The sample may also be a permanent magnet and in this case external field B may not be needed. The field B may be transverse, longitudinal or at any orientation with respect to the driving mode, field or displacements. For convenience here a transverse field B is indicated. Many types of suitable detection coils can be used as indicated in the aforementioned patents and publication.

First and second drivers 12 and 16 are provided and are respectively excited by electrical signals from voltage sources 10 and 14 operating at different frequencies, W1 and W2. More generally, the two sources 10 and 14 provide output signals for the respective first and second modes and accordingly have different frequency spectra or waveforms.

The outputs of the drivers 12 and 16 are applied to the coil 6 or sample 8 in any of several combinations, depending upon the application of the magnetometer. Thus, in a first embodiment which is termed a moving coil — moving sample magnetometer, the driver 12 would impart motion of the first mode to coil 6 while the driver 16 would impart motion of the second mode to the sample 8. In the most general sense, the waveforms of the two driving modes may be of any shape. The waveforms may, for example, be periodic (single frequency or complex) or aperiodic, or combinations thereof. They may produce small or large amplitude motion of the coil and/or sensor. The sample may be simply driven past the coil, through its range of sensitivity from outside of it, with a known translation characterization established by sources 14 and/or 10.

In further embodiments, the windings of coil 6 are excited with the waveform of driver 12 to provide a correspondingly time varying magnetic field gradient in the vicinity of the sample 8. For one embodiment of the magnetometer as a moving coil — applied force device, the excitation from driver 16 is then applied to move the coil 6 for the second mode of excitation. For one embodiment of the magnetometer as a moving sample — applied force device, the sample 8 is moved in response to the output of the driver 16 and driver 12 excites coil 6 to provide a time varying gradient field. The waveforms provided by the drivers 12 and 16 may also be of any general form for periodic or aperiodic motion (or magnetic field variations) in small or large amplitudes. Another embodiment of a moving sample applied force magnetometer utilizes driver 16 to move sample 8 and driver 12 to move gradient producing coil 6, but a DC current is passed through coil 6 to produce a constant gradient magnetic field which is moved by driver 12. It is clear that a multiplicity of additional combinations are feasible in addition to the above examples.

In the four combinations identified above, the output signal on line 17 reflects the influence of a combination of two or more driving modes. The output is generally a modulated signal which includes a signal reflecting the magnetic moment of sample 8 and the waveforms of the two driving modes or frequencies. In the case of the moving coil — moving sample embodiment, this signal may be the voltage output of the coil 6. For the moving coil — applied force or moving sample — applied force embodiments, it is a signal representing the force applied to the sample 8 as detected, for example, by a transducer coupled to the sample 8.

Sensing or detecting transducers as discussed here may be an inductive element (coil), capacitor, electrostrictive or magnetostrictive device, optical or similar device with the function of detecting the forces exerted on the sample, displacement of the sample, or the magnetic flux from the sample. In general, the transducer senses the interaction between the sample and the driving signals as an indication of the magnetic moment of the sample. If the magnetic flux near the sample is sensed, this transducer could be coil 6. If the forces acting on the sample are sensed, a force sensitive transducer may be attached in the vicinity of the sample. If a rigid member drives the sample, the transducer may be attached to it well outside of the region of the fields acting on the sample to minimize interference with the driving signals.

Returning to FIG. 1, the signal on line 17 may be processed in several ways. Where the two modes utilize waveforms which are periodic, detection may be at the difference frequency, (W1) − (W2) in a detector 18, or at the sum frequency (W1) + (W2) in a detector 24. Signal detectors 18 and 24, as well as detectors 22 and 20, described later, may each comprise peak detector or averaging devices such as phase sensitive detectors for deriving an output indication of magnetic moment of the sample. To provide the demodulation reference signals at the two frequencies, W2 and W1 are both applied to mixer 26 or mixer 28 which generate respectively the (W1) + (W2) and (W1) − (W2) signals which are in turn applied as reference signals to detectors 24 and 18. It is also contemplated that signal detection at harmonics of any of the frequencies employed in the detectors 18 and 24 may also be utilized. The outputs of detectors 18 and 24 may also be applied processing circuits 25 and 27 for processing at (W1) − (W2) and (W1) + (W2) as described below. The outputs of detectors 18, 20, 22 and 24 may if desired be supplied to compensation and feedback circuitry as described in the aforesaid copending patent application Ser. No. 513,090, filed Oct. 8, 1974 to provide the signal processing advantages described there. Where one mode of drive is periodic, but the other is not, the signal on line 17 is first detected at the periodic frequency W1 or W2 in detectors 20 or 22 respectively, and then processed further in circuitry 21 or 23 as, for example, by peak detection above a reference level or by detecting the output as a function of sample position. This, for example, may be used where the sample is driven past the sensor coil as on a conveyor.

The advantages of signal detection at two frequencies or two modes, or their harmonics, is that errors in the signal on line 17 that affect only one frequency component (or mode) are eliminated. Specific mode systems and the advantages provided by each are described below.

Figure 4D:
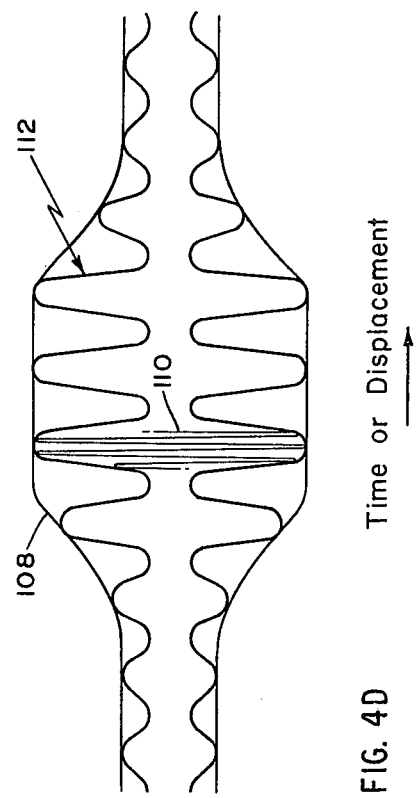
Figure 4A:
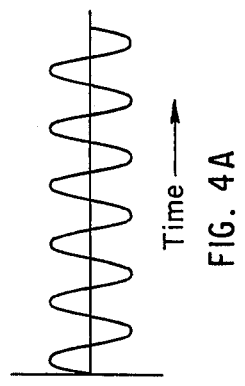
Figure 4B:
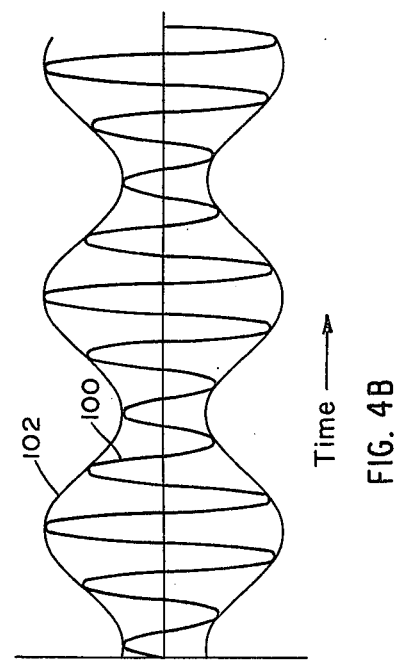

A first specific embodiment of the invention comprising a combination vibrating sample and vibrating coil magnetometer is shown in FIG. 2, and waveform diagrams useful in explaining its operation are shown in FIGS. 4A and 4B.

An AC driver 30 in FIG. 2 provides an AC driving signal at the first frequency W1 to a driving transducer 32. Driving transducer 32 is typically electrostrictive, magnetostrictive, or electromagnetic in operation. A sample 34 whose magnetic moment is to be measured is secured onto a driving rod 36 which is in turn attached to the transducer 32. Forces produced by the transducer at the driving frequency W1 thereby result in a corresponding motion of the sample 34.

Disposed on a rod 38 or other driving means adjacent to the sample 34 is a sensing coil 40 which is operative to sense variations in the magnetic field in the vicinity of the sample 34. Both coil 40 and sample 34 are located in a region between pole faces 42 and 44 of a magnet which produces a magnetic field B in the vicinity of the sample.

A second AC driver 46 drives a transducer 48 at frequency W2 which may be similar to transducer 32. Transducer 48 applies a periodic force at frequency W2 to a rod (structure) 38 which, in turn, drives coil 40 in periodic motion. As suggested in the aforesaid U.S. Pat. No. 3,496,459, the sample 34 may be disposed with respect to the coil 40 to detect the fundamentals or harmonics of the driving frequencies.

A first reference signal sensor 50 is provided to produce an output representative of sample 34 motion and typically includes an energized electromagnet 52 (energized by V1) rigidly secured to rod 36. Alternatively, an electrostatic transducer such as a vibrating capacitor may be employed, or a permanent magnet may be substituted for electromagnet 52 with suitable feedback being supplied. In the embodiment shown, a reference signal sensor coil 54 is disposed around electromagnet 52 to provide a first reference signal output at frequency W1 corresponding to the vibration of the sample 34. A second reference sensor 56, similar to sensor 50, is associated with rod 38 to detect the motion of the vibrating coil 40 typically comprises a coil 57 disposed around an electromagnet 60 (energized by V2) to provide a second reference signal output at a frequency W2 corresponding to the vibration of the coil 40. Sensors 50 and 56 are not restricted to be electromagnetic and may alternatively be electrostatic or electrooptic among other means.

The outputs of sensors 50 and 56 are applied to a mixer 58 which provides an output having frequency components at both the sum and the difference of the two input frequencies W1 and W2. Mixer 58 may also include variable gain amplifiers or variable attenuators and phase shifters for both the W1 and the W2 inputs in order to adjust the relative amplitude and phase of W1 and W2 before mixing. The voltage induced in the vibrating coil 40, which also has both frequency components, is applied to a phase shift network 61 which shifts the (W1) ± (W2) signal in order to adjust its phase relative to the output from the mixer 58. The output from the mixer 58 is applied to a summing circuit 62 together with the phase shifted output of network 61. Summer 62 provides an output signal representing the difference between the reference and coil outputs at the sum and/or difference frequencies.

The output of summer 62 is applied to a phase sensitive detector 64 which detects signals at frequencies equal to the sum or difference of the two driving frequencies W1 and W2. Detector 64 receives a reference phase signal from a mixer 66 with functions similar to mixer 58 which provides an output signal having frequency components equal to the sum or difference of the driving frequencies received from the respective AC drivers 30 and 46. Alternatively, the detector 64 may receive the signals from reference sources 50 and 56, fed to mixer 66. Dectector 64 provides a DC output to a utilization circuit 68 which typically includes output indications such as recorder, feedback voltage generators, or a correlator for correlating the outputs as a function of position, time, etc. Feedback and compensation may also respond to the output of detector 64 as described below.

In an alternative embodiment, where two or more driving signals are applied, two or more detectors may be employed to detect components of the output signal at frequencies which are equal to various combinations of the driving frequencies.

Signal correction circuitry such as that described in the aforesaid copending application Ser. No. 513,090 may also be supplied to provide correction for eddy currents and other out of phase effects.

In an alternative embodiment described below, the sample 34 is not caused by driver 30 to move in periodic motion relative to coil 40, but instead the sample 34 is caused to travel in a unidirectional manner as on a conveyor from a point outside the coil 40 and beyond its sensitivity through the center of the coil 40 to a point again beyond the sensitivity of the coil. This large amplitude displacement of sample with respect to detector may be sinusoidal, periodic or aperiodic depending upon the driving function desired for driver 30.

When used with a single frequency of periodic drive as one mode, and large amplitude unidirectional motion as on a conveyor, the magnetometer may be as shown in FIGS. 3A and 3B. The magnetometer is structured to provide an output in response to the sensor outputs at either driving frequency W1 or W2 with subsequent signal processing at the other of these frequencies or driving wave forms. In the first case, the output from sensor 50 at W1 is phase shifted and varied in amplitude in a network 70 and applied to a summer 72, typically a differential summing circuit, and there combined with the output from coil 40. The output of summer 72 is applied to a detector such as phase sensitive detector 74 which also receives a reference output from AC driver 30. The DC output of detector 74 represents magnetic moment with possible errors from ambient effects and may be supplied as a DC feedback to electromagnet 52 for automatic (electronic) balancing of the magnetometer output signal. A signal processor 78, or data processor is employed to further analyze the output of detector 74 at the second mode representing large amplitude relative displacement of the sample from coil 40 to eliminate ambient error levels. As fully described below, a third mode drive labelled 3D driver 114 furnishes a general third drive to coil 40 and is coupled to utilization circuit 75 which controls and processes information concerning this third mode and the output.

Alternatively, as shown in FIG. 2B, the output of sensor 56 at the frequency W2 is phase shifted and varied in amplitude in a network 80 and combined with the output of coil 40 in a summer 82. The output of summer 82 is then applied to a detector such as a phase sensitive detector 84 which receives a reference output from AC driver 46 and provides a DC output based on frequency components in the output of sensor 56. The output of detector 84 represents magnetic moment with possible errors from ambient effects and may be supplied as a DC feedback signal to electromagnet 60 for automatic balancing of the output signal of coil 40. The DC output of detector 84 is applied to a signal processor 86 for further analysis according to the waveform of the other mode. The outputs of respective detectors 74 and 84 may similarly be applied to signal correction and compensation circuitry such as that described in the aforesaid copending application Ser. No. 513,090 to provide correction for out of phase effects. As taught in the aforesaid U.S. Pat. No. 3,496,459, incorporated herein by reference, the output of coil 40 may be detected at harmonics of one or more driving frequencies.

In FIG. 3C there is shown an application of the circuitry of FIGS. 3A or 3B (specifically FIG. 3B) to detection of magnetic moment of a sample 71 on a conveyor 73. The sample 71 is driven past the coil 40 such that the signal output of the coil 40 will increase from an ambient level representing background signals to a peak when the sample 71 is within the range of sensitivity of coil 40 and then decline to the ambient. For this application, processor 86 (or 78) is a relative peak reader providing an output representing the difference between the peak and ambient (maximum - minimum) signal from detector 84 (or 74). A utilization circuit 75 may respond to this signal to control a conveyor feedback loop 77 through switches 79 to cause reprocessing of sample 71 as in a processor 81 if the detected peak difference, magnetic moment, is outside an acceptable range. Processor 81 may involve a multitude of functions such as a furnace for heat treatment, a magnetic device for magnetically changing the permanent field of the sample or demagnetizing the sample or metallurgical processor which changes the sample composition or weight. The data processor 86 also may compute magnetic moment per unit mass by responding to the output from a weighing station 85 in loop 77 or on conveyor 73. In addition, if the output from the sample is below a given limit, processor 86 may control switches 79 in order to cycle the sample in a unidirectional periodic manner past coil 40 in order to integrate or add the signals for each passage until the signal to noise ratio is adequate for accurate indication. As another example, a standard smaple may be introduced in the loop as a comparison material to monitor processing by element 81. Again, programmed responses of station 85 and processor 86 may be used to control the conveyor line, etc.

A similar utilization of FIG. 3A circuitry may be employed if the sample can be vibrated and the coil 40 caused to scan across the sample.

The operation of the above-described embodiments of the present invention may be understood by reference now to FIGS. 4A-4D. The output of a typical vibrating coil magnetometer is shown in FIG. 4A and has a sinusoidal waveform whose amplitude is proportional to the magnetic moment of the sample added to a term proportional to any magnetic field gradient which is caused by nearby magnetic materials and field inhomogeneities (ambient or environmental effects). Thus the output voltage of a conventional vibrating coil magnetometer may be given to a first order approximation by the expression: $V_{out} = (aH_o + bH_s)\cos(W2)t$ where $a$ is a constant, $H_o$ is the magnetic field inhomogeneity by contributions other than the sample, $b$ is another constant, $H_s$ is the field inhomogeneity produced by the sample, $t$ is the time and W2 is the frequency at which the coil is motionally driven. Note that the sum of sample and other contributions are detected and there is no discrimination between them. If, according to the present invention, the sample is vibrated also, it causes the field inhomogeneity, $H_s$, produced by the magnetic moment of the sample, to vary as a function of time at the frequency of vibration of the sample. This field inhomogeneity is given by the expression: $H_s = (cM)\cos(W1)t$; where $c$ is a constant, M is the magnetic moment of the sample and W1 is the driving frequency of the sample vibration. The typical output of the combined vibrating coil and vibrating sample magnetometer according to one embodiment of the present invention as found as the output of coil 40 may then be expressed as follows:

$$V_{total} = (aH_o + bH_s)\cos(W2)t = aH_o\cos(W2)t + \tfrac{1}{2}bcM[\cos((W1)+(W2))t + \cos((W1)-(W2))t].$$

Thus the output of the magnetometer of the present invention contains the first term proportional to the field inhomogeneity modulated at the frequency W2 which indiscriminately involves the effects of sample and other fields (the usual output for a vibrating coil magnetometer), and a second term proportional only to the magnetic moment of the sample modulated at the sum and difference frequencies (W1) ± (W2). Thus detection of the output of coil 40 at the sum or difference of the two driving frequencies provides an indication of magnetic moment independent of the extraneous field inhomogeneities, Ho. For a more general mode Hs = cMF(t) where F(t) is a general function of t.

In the example of FIG. 2 as analyzed above, the signal due to unwanted field inhomogeneities in Ho (normally present for a vibrating coil magnetometer) has been eliminated in the signal for the desired parameter, Hs. The procedure allows selective discrimination between the moments of the sample and the unwanted background of a vibrating coil magnetometer by adding sample motion.

In some cases sample motion may introduce a large undesired thermal input to the sample causing errors in detected moment. The frequency of the vibrating sample can then be reduced substantially or be made aperiodic and a substantially higher coil vibration frequency may be empoyed for low drift detection of the sample moment.

In the adaption of the present invention shown in FIGS. 3A, B and C, large amplitude periodic or aperiodic sample motion is employed. In this case the sample is passed through the detection coil region (for example, on the assembly line); is modified, replaced by another sample, or standard, or is received through the coil region and time averaged until the averaging increases the signal-to-noise ratio to a useful level.

FIG. 4B illustrates the waveform output of the detector for operation of the present invention with two driving frequencies employed. Where the frequency W1 of sample vibration is significantly less than the frequency W2 of coil vibration, the output of the coil 40 describes a carrier waveform 100 at W2 whose amplitude is modulated by an envelope waveform 102 of frequency W1.

FIG. 4C shows the AC output of the alternative embodiment of a vibrating coil-moving sample magnetometer wherein the sample is moved, as suggested above, in aperiodic unidirectional motion from a position outside the range of detection of the coil past the coil and again out of its detection range. The difference between a peak amplitude level 104 of the output when the sample is within detecting range of the coil and the average peak amplitude level 106 when the sample is out of range, provides an indication of magnetic moment. The output of processors 78 or 86 represents this difference. Correlation of the area of the envelope (between the dashed lines and envelope) versus time or displacement is also an indication of the magnetic moment and may be used as an alternative processing technique.

A further alternative embodiment of the combined vibrating coil and vibrating sample magnetometer of FIG. 2 employs aperiodic or large amplitude relative displacement between sample and coil (a third mode). The resulting output of coil 40 is illustrated in FIG. 4D. The components of the output of the coil 40 at the sum and difference frequencies are shown plotted against displacement or time. The amplitude shown in FIG. 4D shows the resulting envelope 108 (produced by the third mode) superimposed on the envelope 112 (produced by the second mode) which modulated the first mode waveform 110. The addition of this third drive mode permits detection of magnetic moment by analyzing the variation of the envelope 108 for instance by peak detection of the output of detector 64 in FIG. 2.

In a simplification of the structure of FIG. 2 for a vibrating coil - vibrating sample magnetometer of the invention, reference signal sources 52 and 60 and reference signal sensors 54 and 57 are eliminated. The respective reference inputs to mixers 58 and 66 and summer 62 are provided by direct outputs from AC drivers 30 and 46. Similar simplification of FIGS. 3A and 3B can also be made. With the elimination of the reference sources, automatic calibration and correction for amplitude and/or phase changes in transmitting the drive signal to the sample or detector by the driving mechanism is absent and linearity between the driving mechanism and the sample and detector response must be otherwise maintained for accurate operation.

Referring now to FIG. 5, an example of circuitry employed for a combined vibrating coil and applied force magnetometer is illustrated. As in the vibrating coil - vibrating sample magnetometer described with respect to FIG. 2, a sample 120 is suspended on a rod 122 which is in turn fixed to a transducer 140. Sample 120 is disposed between the opposite pole faces 126 and 128 of the magnet which produces a magnetic field, B, in the vicinity of the sample 120. A coil 130 is disposed adjacent the sample and is electrically excited at a frequency W1 by a signal from an AC driver 132 to provide a time varying field gradient near sample 120. Coil 130 is fixed onto a mounting member such as a rod 134 which is in turn attached to a transducer 136. A second AC driver 138 provides a driving signal at a second frequency, W2, to the transducer 136 to cause vibration of the coil 130 in the vicinity of the sample 120. The transducer 140 senses forces on the sample. The output signal from transducer 140 is used as an alternative input to summers 72 and 82 or phase shift network 61 shown in FIGS. 3A, 3B and 2 respectively. Reference signals may be provided and sensed as illustrated in FIG. 2 and detection or analysis of the magnetic moment indicating signals at the two driving frequencies, as at the sum and difference of the driving signal frequencies or their harmonics, may be provided as described above in connection with the apparatus shown in FIGS. 2, 3A or 3B. A feedback network may be provided to feed a signal to transducer 140 from one of the detectors such as detectors 18, 20, 22 or 24. The feedback network in such case would typically comprise a variable gain amplifier 141 which provides a control over the W2 signal level (or W1, or W1 ± W2 depending on excitation of transducer 140) to provide force cancellation through transducer 140. A phase shifter 143 provides proper phasing to insure force cancellation or nulling. An additional transducer also may be used in order to balance the applied forces so that at balance the sample displacement is nulled.

Coil 130 may be replaced by two separate coils disposed in the vicinity of the sample. In such a case, one coil would receive a signal at frequency W1 from driver 132 to provide an AC driving field gradient, and the other coil would be vibrated in the vicinity of the sample in response to a driving signal at frequency W2 from driver 138.

FIG. 6 shows a combined applied force - vibrating sample magnetometer in which a driving signal is applied to a transducer 150 from an AC driver 152 at frequency W1. In response to this signal, the transducer 150 applies a vibration to a sample 154 through a rigid mechanical connection 156. Sample 154 is disposed between the opposite pole faces 158 and 160 of a magnet which provides magnetic field B in the vicinity of the sample 154. Disposed adjacent the sample 154 is a coil 162 which is energized by an AC driving signal at frequency W2 from an AC driver 164 to provide an AC gradient field in the vicinity of the sample 154. The AC gradient field results in the application of an AC varying force at the sample which is transmitted along the connection 156 to transducer 170. The composite signal that results at the transducer 170 is applied to summers 72, 82 or phase shift network 61 in FIGS. 3A, 3B or 2 respectively. Reference signals are provided for use in these embodiments in the same manner illustrated in FIGS. 3A, 3B or 2 and detection of the magnetic moment indicating signals at the two driving frequencies, as at the sum and difference of the driving signal frequencies, or their harmonics, is achieved using the apparatus shown in FIGS. 3A, 3B and 2. Sensor transducer 170 may be magnetic or electric, optical, etc. and sense the displacement of connection 156, for example, and thus indicate the displacement of sample 154. For example, the motion of magnet or capacitor plates mounted on connection 156 can be detected by a corresponding coil or capacitor plates respectively in the vicinity. An alternative embodiment of a combined vibrating sample -applied force magnetometer may be constructed wherein a transducer 180 receives a feedback signal which cancels the forces acting in sample 154 resulting in a balancing of the forces on the sample 154 so that transducer 170 acts as a null sensor. Such a system is shown in FIG. 5.

In a further use for the magnetometer of the present invention where the sample comprises an inhomogeneous mass, the magnetometer coil is vibrated at one frequency to provide the first mode of drive. The coil is then driven in a three-dimensional translational and/or rotational scan (general motion) as by driver 114 in FIG. 3A about the sample to provide a magnetic moment varying with position and orientation of the coil with respect to the sample. The related motion of sample and magnetometer produced by driver 114 may be achieved by moving either or both of the sample and magnetometer in any convenient way. A record of magnetic moment against position may then be made by a recorder within the utilization circuit 75 to permit subsequent analysis by known techniques to provide a complete magnetic profiling of the sample.

The above-described preferred embodiments are intended to be exemplary only, the scope of the invention being intended to be defined only in accordance with the following claims.

What is claimed is:

1. A magnetometer for measuring the magnetic moment of a sample comprising:
    means for applying a driving force to said sample;
    sensor means for providing an output indication of the magnetic moment of said sample;
    means for applying a driving signal to said sensor means whereby said output indication comprises a signal responsive to said driving signal modulated by a function of the position of said sample relative to the position of said sensor means;
    at least one of said driving force and said driving signal producing relative motion between said sample and said sensor means.

2. The magnetometer of claim 1 further including means for changing the temperature of said sample.

3. The magnetometer of claim 1 further including means for applying radiant energy to said sample.

4. The magnetometer of claim 1 wherein said sensor means includes a peak detector for providing a representation of magnetic moment in response to said output indication.

5. The magnetometer of claim 4 wherein said peak detector includes means for detecting the difference between the peak amplitude of said output indication and a predetermined signal level.

6. The magentometer of claim 1 further comprising averaging means for determining the magnetic moment of said sample in response to said output indication.

7. The magnetometer of claim 1 wherein said means for applying a driving force comprises:
    an AC signal source having an output signal at a first frequency;
    a transducer providing an AC force output in response to the output of said AC signal source at said first frequency; and
    means for coupling said AC force output at said first frequency to said sample.

8. The magnetometer of claim 7 wherein said coupling means includes a rigid attachment.

9. The magnetometer of claim 7 wherein:
    said sensor means comprises a coil disposed adjacent said sample and providing said output indication; and
    said means for applying a driving signal to said sensor comprises:
    a second AC signal source having an output signal at a second frequency;
    a second transducer providing an AC force output in response to said output signal at said second frequency; and
    means for coupling the force output of said second transducer to said coil.

10. The magnetometer of claim 19 wherein said coupling means includes rigid attachments.

11. The magnetometer of claim 1 further comprising:
    a first reference signal source providing an output signal representative of the response of said sample to the driving force applied thereto;
    a second reference signal source providing an output signal representative of the response of said sensor means to the driving signal applied thereto;
    means for combining the output indication of said sensor means with the output of said first and second reference signal sources to provide a representation of magnetic moment of said sample.

12. The magnetometer of claim 1 wherein:
    a region exists surrounding said sensor means wherein said sensor means has a significant sensitivity to the magnetic moment of the sample and beyond which region said sensor has substantially changed sensitivity to the magnetic moment of said sample; and
    means are provided for causing relative motion between said sample and said sensor means along a path having a portion within said region and a portion outside of said region.

13. The magnetometer of claim 12 wherein said motion includes large amplitude general motion of said sample with respect to said sensor means.

14. The magnetometer of claim 13 wherein the large amplitude general motion includes three-dimensional displacement, rotation, or combinations thereof.

15. The magnetometer of claim 13 wherein said large amplitude general motion is unidirectional.

16. The magnetometer of claim 13 wherein said means for causing relative motion causes motion of said sample means.

17. The magnetometer of claim 12 wherein said means for causing relative motion provides a large amplitude general motion of said sensor means.

18. The magnetometer of claim 1 wherein:
said sensor means comprises a coil;
said means for applying a driving signal comprises:
an AC signal source having an output signal at a first frequency;
a transducer providing an AC force output in response to the output signal at said first frequency; and
means for coupling the AC force output of said transducer to said coil to cause vibration of said coil at said first frequency.

19. The magnetometer of claim 18 wherein at least for one position of said sample, the sample is within the range of sensitivity of said sensor means.

20. The magnetometer of claim 1 wherein:
said output indication comprises a signal responsive to both said driving force and said driving signal.

21. A magnetometer for measuring the magnetic moment of a sample comprising:
means for applying a driving force to said sample;
sensor means for providing an output indication of the magnetic moment of said sample;
means for applying a driving signal to said sensor means whereby said output indication comprises a signal responsive to said driving signal modulated by a function of the force on said sample.

22. The magnetometer of claim 21 further including feedback means for (null) balancing sample motion in response to the applied driving force and driving signal.

23. The magnetometer of claim 22 wherein said sensor means includes a peak detector for providing a representation of magnetic moment.

24. The magnetometer of claim 23 wherein said peak detector includes means for detecting the difference between the peak amplitude in said output indication and a predetermined signal level.

25. The magnetometer of claim 21 further comprising averaging means for determining the magnetic moment of said sample.

26. The magnetometer of claim 21 wherein said means for applying a driving force comprises:
an AC signal source having an output signal at a first frequency;
a transducer providing an AC force output in response to the output of said AC signal source at said frequency; and
means for coupling said AC force output at said first frequency to said sample.

27. The magnetometer of claim 26 wherein said coupling means includes a rigid attachment.

28. The magnetometer of claim 26 wherein:
said sensor means comprises a coil disposed adjacent said sample and providing said output indication; and
said means for applying a driving signal to said sensor comprises:
a second AC signal source having an output signal at a second frequency;
a second transducer providing an AC force output in response to said output signal at said second frequency; and
means for rigidly attaching said coil to said second transducer to couple the force output thereof to said coil.

29. The magnetometer of claim 28 wherein said coupling means includes rigid attachments.

30. The magnetometer of claim 21 further comprising:
a first reference signal providing an output signal representative of the driving force applied to said sample;
a second reference signal source providing an output signal representative of the driving signal applied to said sensor means;
means for combining the output indication of said sensor means with the output of said first and second reference signal sources to provide a representation of magnetic moment of said sample.

31. The magnetometer of claim 30 further including feedback means for (null) balancing sample motion in response to the applied driving force.

32. The magnetometer of claim 21 wherein:
a region exists surrounding said sensor means wherein said sensor means has a significant sensitivity to the magnetic moment of the sample and beyond which region said sensor has substantially reduced sensitivity to the magnetic moment of said sample; and
means are provided for causing relative motion between said sample and said sensor means along a path having a portion within said region and a portion outside of said region.

33. The magnetometer of claim 32 wherein said motion includes large amplitude general motion of said sample with respect to said sensor means.

34. The magnetometer of claim 33 wherein the large amplitude general motion includes three-dimensional displacement, rotation and combinations thereof.

35. The magnetometer of claim 33 wherein said large amplitude general motion is unidirectional.

36. The magnetometer of claim 33 wherein said means for causing relative motion causes motion of said sample means.

37. The magnetometer of claim 32 wherein said means for causing relative motion provides a large amplitude general motion of said sensor means.

38. The magnetometer of claim 21 wherein:
said sensor means comprises a coil;
said means for applying a driving signal comprises:
an AC signal source having an output signal at a first frequency;
a transducer providing an AC force output in response to the output signal at said first frequency; and
means for coupling the AC force output of said transducer to said coil to cause vibration of said coil at said first frequency.

39. The magnetometer of claim 38 wherein at least for some position of said sample, the sample is within the range of sensitivity of said sensor means.

40. A combined vibrating sample-vibrating sensor magnetometer for detecting the magnetic moment of a sample comprising:
a first AC signal source having an output signal at a first frequency;
a first transducer providing an AC force output in response to the output signal at said first frequency;
means for coupling said sample to said first transducer to transmit said AC force at said first frequency to said sample;

a second AC signal source having an output signal at a second frequency;

a second transducer providing an AC force output in response to the output signal at said second frequency;

a sensor disposed adjacent said sample and providing an output representation;

means for coupling said sensor to said second transducer to transmit the AC force output thereof at said second frequency to said sensor;

the output from said sensor comprising a signal at the $n$'th harmonic (where $n$ is a positive integer) of said second frequency modulated by the $n$'th harmonic (where $n$ is a positive integer) of said first frequency; and means for analyzing said output representation at signal frequencies equal to the sum or difference of said $n$'th harmonics of first and second driving frequencies to provide an indication of magnetic moment of said sample.

41. The magnetometer of claim 40 wherein said sensor is a coil.

42. A combination moving coil and applied force magnetometer comprising:

a first signal source having a signal output time varying with a first characteristic;

a second signal source having a signal output time varying with a second characteristic;

magnetic field gradient producing means responsive to the output signal with said first characteristic for providing a time varying magnetic field gradient in the vicinity of said sample;

means for moving said gradient field producing means in response to and in a manner representative of the output signal with said second characteristic;

sensor means for detecting forces applied to said sample and for providing an output representation thereof, said output representation having signal components with said first and second characteristics; and means for providing an output indication of magnetic moment from said output representation as a function of both said first and second time varying characteristics.

43. The magnetometer of claim 42 further including means for providing general motion of said sample with respect to said sensor means.

44. The magnetometer of claim 42 wherein said sensor means is also the field gradient producing means.

45. A combination moving sample, moving gradient field and applied force magnetometer comprising:

a first signal source having a signal output time varying with a first characteristic;

a second signal source having a signal output time varying with a second characteristic;

transducer means for applying a force to the sample in response to and in a manner representative of the output signal with said first characteristic;

magnetic field gradient producing means for providing a magnetic field gradient in the vicinity of said sample;

means for moving said gradient field producing means in response to and in a manner representative of the output signal with said second characteristic;

sensor means for detecting forces applied to said sample for providing an output indication representative thereof and having signal components with said first and second characteristics; and means for providing an output indication of magnetic moment from said output representation as a function of both said first and second time varying characteristics.

46. The magnetometer of claim 45 further including means for providing relative motion between said sample and said means for providing a magnetic field gradient.

47. The magnetometer of claim 45 wherein at least one of said first and second output signal characteristics is aperiodic.

48. A combination moving coil and applied force magnetometer for detecting the magnetic moment of a sample comprising:

a first AC signal source providing an AC signal output at a first frequency;

a second AC signal source providing an AC signal output at a second frequency;

a first transducer coupled to said sample and providing an output representative of force applied to said sample;

a coil disposed adjacent said sample and providing an AC magnetic field gradient output at said sample in response to the AC signal output at said first frequency;

a second transducer providing an AC force output in response to said AC signal output at said second frequency;

means for coupling said coil to said second transducer to cause vibration of said coil at said second frequency;

said output representative of applied force comprising a signal component at the $n$'th harmonic (where $n$ is a positive integer) of said first and second frequencies; and means for analyzing said output representative of applied force at the sum or difference of said $n$'th harmonic of first and second frequencies to provide an output indication of magnetic moment of said sample.

49. A combination moving sample and applied force magnetometer comprising:

means for applying a driving force to said sample having a first time varying characteristic;

means for applying an AC magnetic field gradient in the vicinity of said sample, said AC field gradient having a second time varying characteristic;

means for sensing the force applied to said sample as a function of said first and second time varying characteristics; and said sample moving relative to said sensing means as a result of the applied driving force;

means responsive to the sensed force for providing an output indication of magnetic moment of said sample as a demodulation function of said first and second charatistics.

50. A combination moving sample and applied force magnetometer comprising:

a first AC signal source providing an AC signal output at a first frequency;

a second AC signal source providing an AC signal output at a second frequency;

a first transducer providing an AC force output in response to the AC signal output at said first frequency;

means for coupling the AC force output of said first transducer to said sample;

a second transducer coupled to said sample and providing an output signal representative of force applied to said sample;

a coil disposed adjacent said sample and responsive to the AC signal output at said second frequency to provide an AC magnetic field gradient in the vicinity of said sample;

said output from said second transducer comprising a signal which is a function of said first and second frequencies; and means for analyzing the output of said second transducer at a signal frequency equal to the sum or difference of said first and second frequencies to provide an indication of the magnetic moment of said sample.

51. The magnetometer of claim 1 including means for providing combined general motion of said sample with respect to said sensor whereby the output indication of magnetic moment provides an indication of the magnetic moment of said sample as a function of said combined general motion.

52. The magnetometer of claim 21 including means for providing combined general motion of said sample with respect to said sensor whereby the output indication of magnetic moment provides an indication of the magnetic moment of said sample as a function of said combined general motion.

53. The magnetometer of claim 40 including means for providing combined general motion of said sample with respect to said sensor whereby the output indication of magnetic moment provides an indication of the magnetic moment of said sample as a function of said combined general motion.

54. The magnetometer of claim 42 including means for providing combined general motion of said sample with respect to said sensor whereby the output indication of magnetic moment provides an indication of the magnetic moment of said sample as a function of said combined general motion.

55. The magnetometer of claim 45 including means for providing combined general motion of said sample with respect to said sensor whereby the output indication of magnetic moment provides an indication of the magnetic moment of said sample as a function of said combined general motion.

56. The magnetometer of claim 48 including means for providing combined general motion of said sample with respect to said sensor whereby the output indication of magnetic moment provides an indication of the magnetic moment of said sample sa a function of said combined general motion.

57. The magnetometer of claim 49 including means for providing combined general motion of said sample with respect to said sensor whereby the output indication of magnetic moment provides an indication of the magnetic moment of said sample as a function of said combined general motion.

58. The magnetometer of claim 1 further including means responsive to said output indication for detecting magnetic moment as a demodulation function of both the driving signal and driving force.

59. The magnetometer of claim 21 wherein said sensor means includes means for detecting magnetic moment as a demodulation function of both said driving signal and said driving force.

* * * * *

UNITED STATES PATENT AND TRADEMARK OFFICE
CERTIFICATE OF CORRECTION

PATENT NO. : 4,037,149
DATED : July 19, 1977
INVENTOR(S) : Simon Foner

It is certified that error appears in the above-identified patent and that said Letters Patent are hereby corrected as shown below:

Column 2, line 24, "of" (first occurrence) should read --in--.

Column 2, line 38, "know" should read --known--.

Column 2, line 42, after "may" (first occurrence) insert --also--.

Column 5, line 22, after "applied" insert --to--.

Column 8, line 22, "smaple" should read --sample--.

Column 8, line 63, "[[cos" should read --[cos--.

Column 9, line 23, "empolyed" should read --employed--.

Column 12, line 11, "magentometer" should read --magnetometer--.

Column 12, line 38, "claim 19" should read --claim 9--.

Signed and Sealed this

*Eighth* Day of *November 1977*

[SEAL]

*Attest:*

RUTH C. MASON
*Attesting Officer*

LUTRELLE F. PARKER
*Acting Commissioner of Patents and Trademarks*